(12) United States Patent
Iidaka

(10) Patent No.: US 9,907,158 B2
(45) Date of Patent: Feb. 27, 2018

(54) WIRING STRUCTURE AND PRINTED WIRING SUBSTRATE OF WIRING STRUCTURE

(71) Applicant: ALPINE ELECTRONICS, INC., Tokyo (JP)

(72) Inventor: Kenji Iidaka, Fukushima (JP)

(73) Assignee: ALPINE ELECTRONICS INC., Tokyo (JP)

( * ) Notice: Subject to any disclaimer, the term of this patent is extended or adjusted under 35 U.S.C. 154(b) by 0 days.

(21) Appl. No.: 15/388,600

(22) Filed: Dec. 22, 2016

(65) Prior Publication Data

US 2017/0215275 A1    Jul. 27, 2017

(30) Foreign Application Priority Data

Jan. 25, 2016 (JP) ................................. 2016-011391

(51) Int. Cl.
| | |
|---|---|
| H05K 7/00 | (2006.01) |
| H05K 1/02 | (2006.01) |
| H05K 1/11 | (2006.01) |
| H05K 1/18 | (2006.01) |

(52) U.S. Cl.
CPC ........... *H05K 1/0228* (2013.01); *H05K 1/115* (2013.01); *H05K 1/181* (2013.01); *H05K 1/116* (2013.01); *H05K 2201/0245* (2013.01); *H05K 2201/09236* (2013.01); *H05K 2201/09263* (2013.01); *H05K 2201/09272* (2013.01)

(58) Field of Classification Search
USPC ................................................. 361/760, 761
See application file for complete search history.

(56) References Cited

U.S. PATENT DOCUMENTS

2007/0034404 A1* 2/2007 Shin .................. H01L 23/49838
174/261

FOREIGN PATENT DOCUMENTS

| | | |
|---|---|---|
| DE | 3447 556 A1 | 7/1986 |
| EP | 1 549 118 A2 | 6/2005 |
| JP | A1 2003-258394 | 12/2003 |

OTHER PUBLICATIONS

Extended European Search Report in related EPO application No. 16 206 315.0, dated Jun. 29, 2017 (9 pgs).
Manual for Printed Circuit Boards, Issued Jul. 20, 2000/Wi (3 pgs).
Khandpur Printed Circuit Boards (pp. 166-167).

* cited by examiner

*Primary Examiner* — Andargie M Aychillhum
(74) *Attorney, Agent, or Firm* — Brinks Gilson & Lione

(57) ABSTRACT

A wiring structure includes a plurality of wiring patterns. An interval between the adjacent wiring patterns is shortened in the parallel wiring portions. In wiring path change portions, the wiring patterns are extended at a slope with respect to an X direction, and an interval between the adjacent wiring patterns is more widened than the interval. A crosstalk noise can be reduced by widening the interval between the wiring patterns using the wiring path change portions without making an area occupied by a wiring region extremely increased.

8 Claims, 7 Drawing Sheets

WIRING STRUCTURE AND PRINTED WIRING SUBSTRATE OF WIRING STRUCTURE

RELATED APPLICATION

The present application claims priority to Japanese Patent Application Number 2016-011391, filed Jan. 25, 2016, the entirety of which is hereby incorporated by reference.

BACKGROUND

1. Field

The present disclosure relates to a wiring structure of a wiring pattern which is formed on a hard substrate or a flexible substrate, and a printed wiring substrate of the wiring structure.

2. Description of Related Art

A plurality of wiring patterns are formed on a printed wiring substrate which is provided in an electronic apparatus, and the wiring patterns tend to be densely disposed when the electronic apparatus is miniaturized. When the wiring patterns are densely disposed in parallel to each other, there may cause a capacitive coupling due to a mutual capacitance and an inductive coupling due to a mutual inductance between the adjacent wiring patterns. Therefore, when a digital signal is applied to the wiring pattern, a crosstalk noise is generated between the wiring patterns, and the crosstalk noise is increased as a transmission rate becomes higher.

JP 2003-258394 A discloses a wiring substrate in which an influence of the crosstalk is reduced. In the wiring substrate, one wiring is formed in a straight line shape, and the other wiring extending along the one wiring is bent. An approaching place and a separating place of the two wirings are alternately repeated.

According to the disclosure of JP 2003-258394 A, a transfer length of signals of one wiring extending in the straight line shape is different from that of the other wiring having the bent portion. Therefore, when the crosstalk is generated between the wirings, timings of generating the crosstalk is deviated in the one wiring and the other wiring, so that the energy of the crosstalk can be dispersed.

SUMMARY

The wiring substrate disclosed in JP 2003-258394 A is configured such that the one wiring extending in the straight line shape and the wiring having the bent portion are disposed in parallel to each other. Therefore, there is a need to provide a wide space for the wirings in a direction perpendicular to the extending direction of the wirings, and thus it is difficult to dispose the wirings in a small wiring substrate.

In addition, since there is a difference caused in the wiring length due to the one wiring extending in the straight line shape and the other wiring which is bent, these wirings are not suitable to a circuit design such as a high-speed interface which requires a timing control.

The present disclosure has been made to solve the conventional problems, and an object thereof is to provide a wiring substrate which is capable of reducing the crosstalk between the wirings, and a printed wiring substrate which includes the wiring substrate by reducing a difference in wiring length of a plurality of wiring patterns without causing a significant increase of a wiring space.

The present disclosure is a wiring structure including a plurality of wiring patterns, wherein the plurality of wiring patterns include a parallel wiring portion that is extended in parallel to a first direction, and a wiring path change portion that is extended in the middle of the parallel wiring portion and in a direction where the wiring patterns are intersected with the first direction, and wherein an interval between the wiring patterns in the wiring path change portion is wider than an interval of the wiring patterns in the parallel wiring portion.

In the wiring structure according to the present disclosure, the wiring path change portion can be positioned between two parallel wiring portions which are shifted in a second direction perpendicular to the first direction.

For example, the wiring structure according to the present disclosure further includes: a first parallel wiring portion; a second parallel wiring portion that is shifted from the first parallel wiring portion in the second direction; and a third parallel wiring portion that is shifted from the second parallel wiring portion in the second direction, wherein the wiring path change portion is provided between the first parallel wiring portion and the second parallel wiring portion and between the second parallel wiring portion and the third parallel wiring portion.

In such case, the wiring patterns forming the first parallel wiring portion and the wiring patterns forming the third parallel wiring portion can be positioned on the same line in the first direction.

In the wiring structure according to the present disclosure, for example, the wiring patterns are parallel to each other in the wiring path change portion.

A printed wiring substrate according to the present disclosure includes the wiring structure according to any one of the above on a surface of a substrate.

In the printed wiring substrate according to the present disclosure, a through hole is formed at a place facing the wiring path change portion.

Alternatively, in the printed wiring substrate according to the present disclosure, an electronic component is disposed at a place facing the wiring path change portion.

In a wiring structure and a printed wiring substrate of the disclosure, the wiring space in a second direction can be made narrow by reducing an interval between the wiring patterns in a parallel wiring portion. In addition, the interval between the wiring patterns can be widened in a wiring path change portion. Therefore, a capacitive coupling and an inductive coupling between the wiring patterns can be reduced, and the crosstalk noise between the wiring patterns can be reduced.

DETAILED DESCRIPTION

Figure 1:
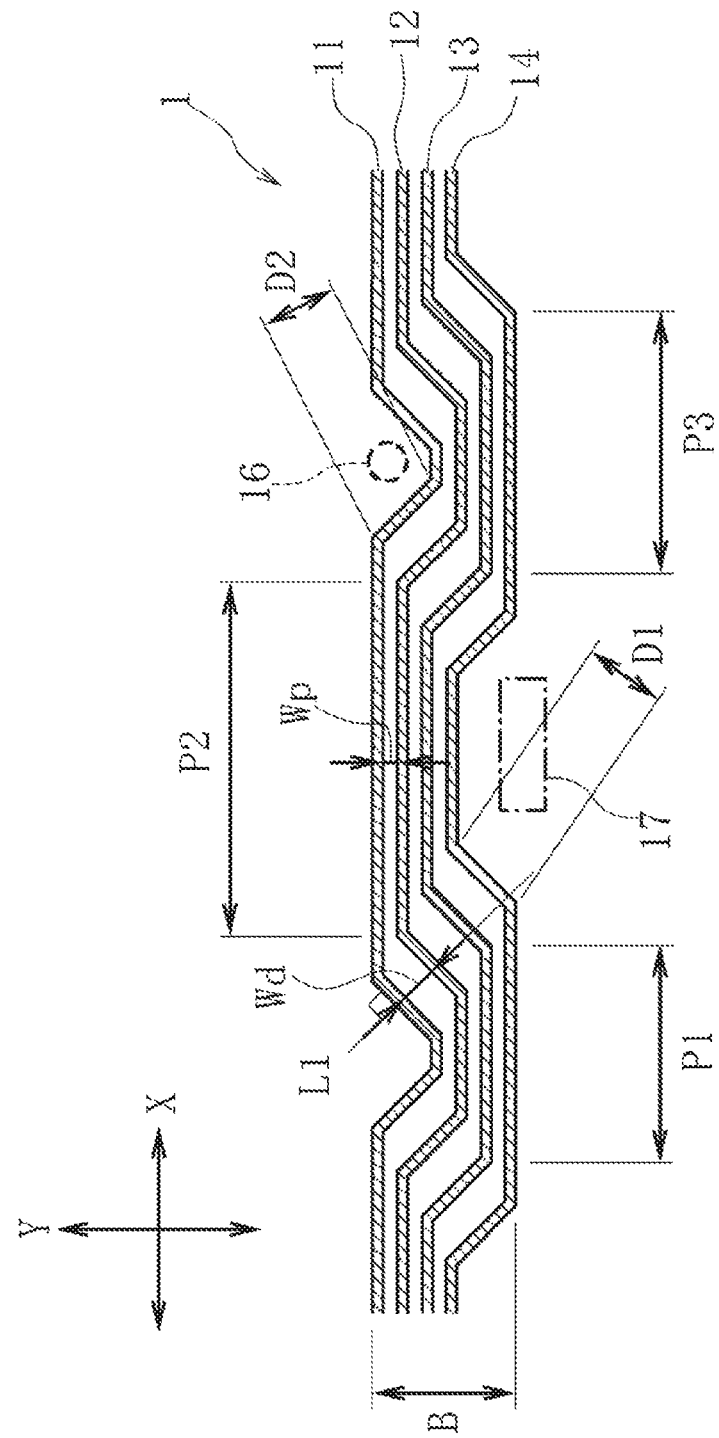
FIG. 1 is a plan view illustrating a wiring structure of a first embodiment of the disclosure.

FIG. 1 illustrates a plan view of a wiring structure 1 of a first embodiment of the disclosure. The wiring structure 1 is formed on the surface of a hard substrate or a flexible substrate to form a printed wiring substrate. In each drawing, an X direction represents a first direction, and a Y direction perpendicular to the X direction represents a second direction.

The wiring structure 1 includes a plurality of wiring patterns 11, 12, 13, and 14. The wiring patterns 11, 12, 13, and 14 are made of a conductive metal layer such as a copper foil.

The wiring structure 1 illustrated in FIG. 1 includes a first parallel wiring portion P1, a second parallel wiring portion P2, and a third parallel wiring portion P3. In the first parallel wiring portion P1, the second parallel wiring portion P2, and the third parallel wiring portion P3, at least two of the wiring patterns 11, 12, 13, and 14 are disposed to be linearly extended or paralleled to each other in the first direction (X direction). An interval in the second direction (Y direction) of the wiring patterns in which the wirings are disposed in parallel is Wp.

In the first parallel wiring portion P1 and the third parallel wiring portion P3, the wiring patterns 11, 12, 13, and 14 are positioned on a virtual common straight line extending in the first direction (X direction). The wiring patterns 11, 12, 13, and 14 of the second parallel wiring portion P2 are formed to be shifted in the second direction (Y direction) with respect to the wiring patterns 11, 12, 13, and 14 of the first parallel wiring portion P1 and the third parallel wiring portion P3.

A first wiring path change portion D1 is provided between the first parallel wiring portion P1 and the second parallel wiring portion P2, and a second wiring path change portion D2 is provided between the second parallel wiring portion P2 and the third parallel wiring portion P3.

In the first wiring path change portion D1 and the second wiring path change portion D2, the wiring patterns 11, 12, 13, and 14 are extended at a slope in a direction intersecting the first direction (X direction), and the wiring patterns 11, 12, 13, and 14 are parallel to each other. In the first wiring path change portion D1 and the second wiring path change portion D2, at least two of the wiring patterns 11, 12, 13, and 14 are separated in the first direction (X direction), and an interval Wd between at least two wiring patterns is larger than the interval Wp in the parallel wiring portions P1, P2, and P3. The interval Wp herein is an interval between the adjacent wiring patterns on a line L1 perpendicular to any one of the wiring patterns.

As illustrated in FIG. 1, a through hole 16 passing through the substrate is formed in an area facing toward the second wiring path change portion D2. In addition, an electronic component 17 is mounted on the substrate in the area facing the first wiring path change portion D1 and the second wiring path change portion D2. The electronic component 17 includes an integrated circuit, a resistor, a capacitor, an inductance element, a switch, and a connector. The wiring patterns 11, 12, 13, and 14 can be arranged to make a detour around the through hole 16 and the electronic component 17 by providing the wiring path change portions D1 and D2 between the parallel wiring portions P1, P2, and P3.

Figure 2:
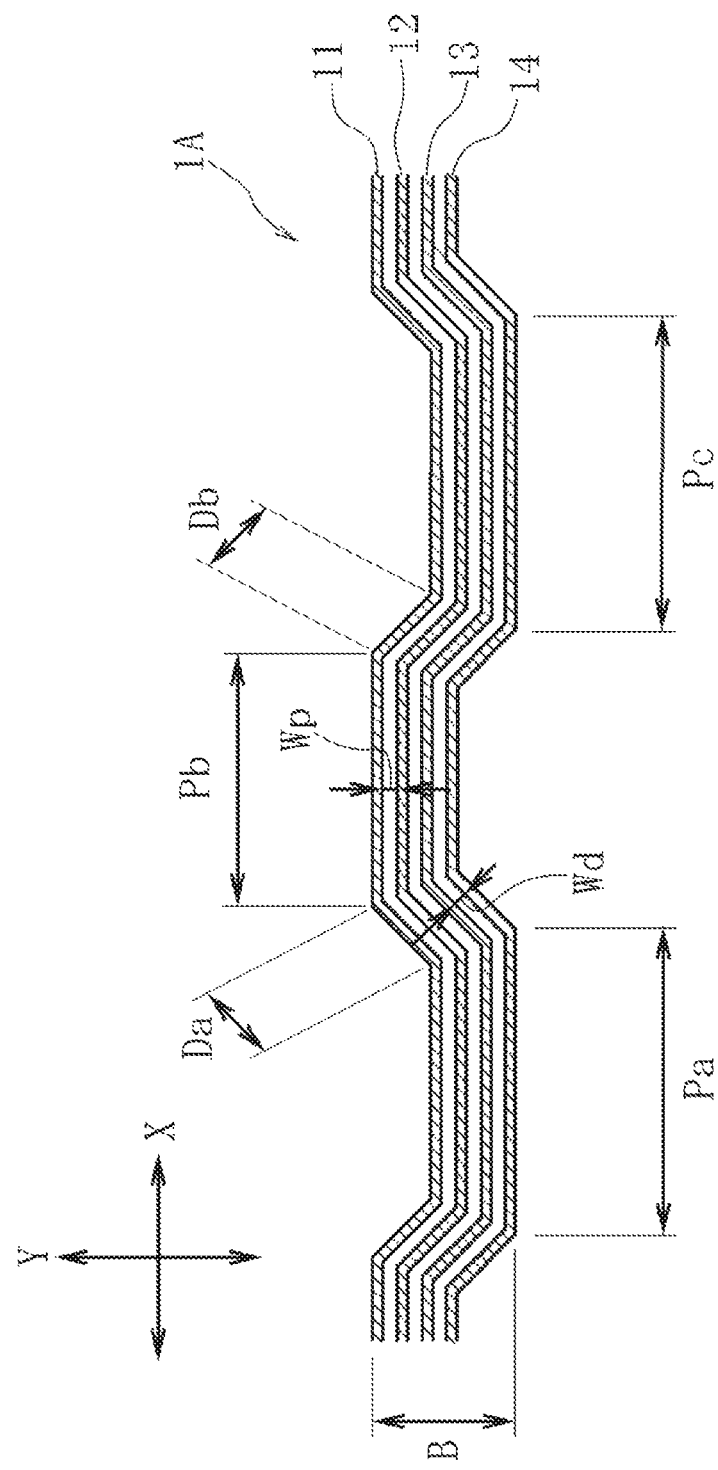
FIG. 2 is a plan view illustrating a wiring structure of a comparative example.

FIG. 2 illustrates a wiring structure 1A as a comparative example. In the wiring structure 1A, there are configured the wiring patterns 11, 12, 13, and 14 having the same thickness as that of the wiring structure 1 of the first embodiment illustrated in FIG. 1.

Also in the wiring structure 1A, the parallel wiring portions Pa, Pb, and Pc and wiring path change portions Da and Db are alternately formed. However, in both of the parallel wiring portions Pa, Pb, and Pc and the wiring path change portions Da and Db, the interval Wp between the adjacent wiring patterns in all of the wiring patterns 11, 12, 13, and 14 are equal. The interval Wp illustrated in FIG. 2 is the same as that in the parallel wiring portions P1, P2, and P3 in the wiring structure 1 of the first embodiment illustrated in FIG. 1.

In the wiring structure 1 of the first embodiment illustrated in FIG. 1, the interval Wd between the adjacent wiring patterns is widened in the first wiring path change portion D1 and the second wiring path change portion D2. Therefore, it is possible to reduce a capacitive coupling and an inductive coupling between the adjacent wiring patterns, and the crosstalk noise of signals between the wiring patterns can be reduced. However, the entire width dimension B in the second direction (Y direction) is the same in the wiring structure 1 of the first embodiment illustrated FIG. 1 and in the wiring structure 1A of the comparative example illustrated in FIG. 2. When the wiring structure 1 of the first embodiment is employed, there is no need to secure a wiring space more than necessary. In addition, there is generated no large difference in wiring lengths of all of the wiring patterns 11, 12, 13, and 14. Therefore, the wiring structure is suitable for a high-speed interface where a timing control is necessary.

Figure 3:
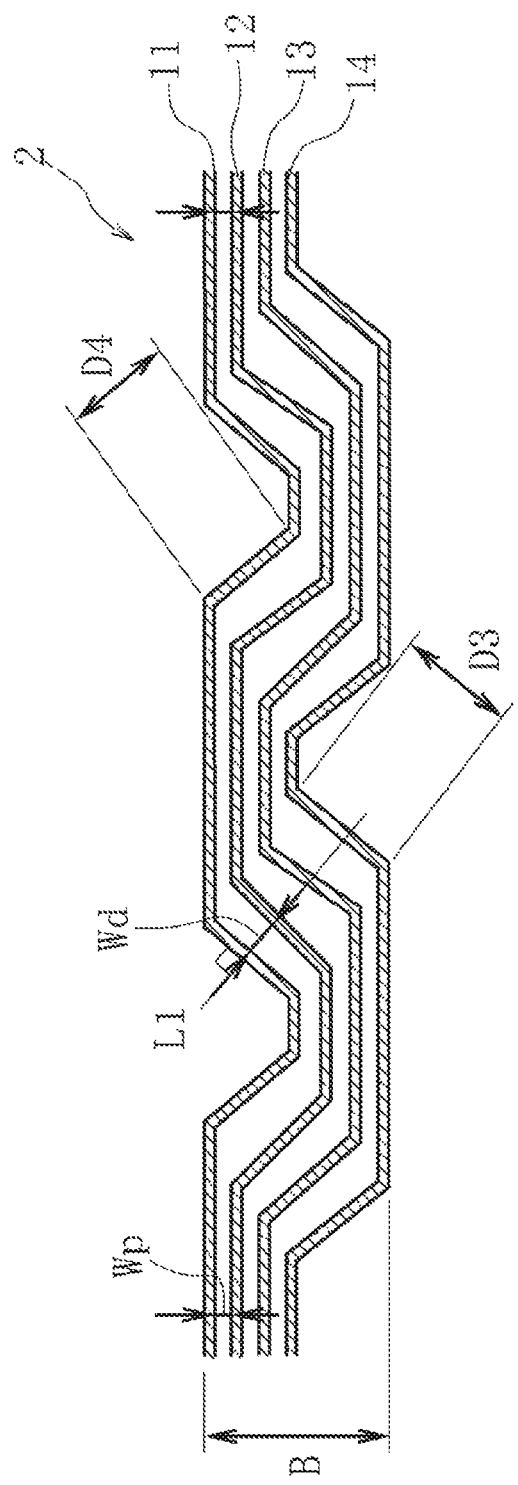
FIG. 3 is a plan view illustrating a wiring structure of a second embodiment of the disclosure.

FIG. 3 illustrates a wiring structure 2 of a second embodiment of the disclosure. In the wiring structure 2 of the second embodiment, the interval Wp between the wiring patterns 11, 12, 13, and 14 in the parallel wiring portion is the same as that of the wiring structure 1 illustrated in FIG. 1.

In wiring path change portions D3 and D4 of the wiring structure 2, the wiring patterns 11, 12, 13, and 14 are extended at a slope in a direction intersecting with the first direction (X direction), but the adjacent wiring patterns are not parallel to each other. The interval Wd1 between the wiring patterns is different by cases. However, an average value of the interval Wd1 between the adjacent wiring patterns in the wiring path change portions D3 and D4 is larger than that of the interval Wp in the parallel wiring portion.

Even in the wiring structure 2, it is possible to prevent an increase of the width dimension B occupied in the second direction (Y direction). Furthermore, the crosstalk noise can be reduced. In addition, when the adjacent wiring patterns are not parallel to each other in the wiring path change portions Da and Db and the interval Wd1 is changed in cases, the inductive coupling due to a mutual inductance can be reduced, and the crosstalk noise can be reduced further.

Figure 4:
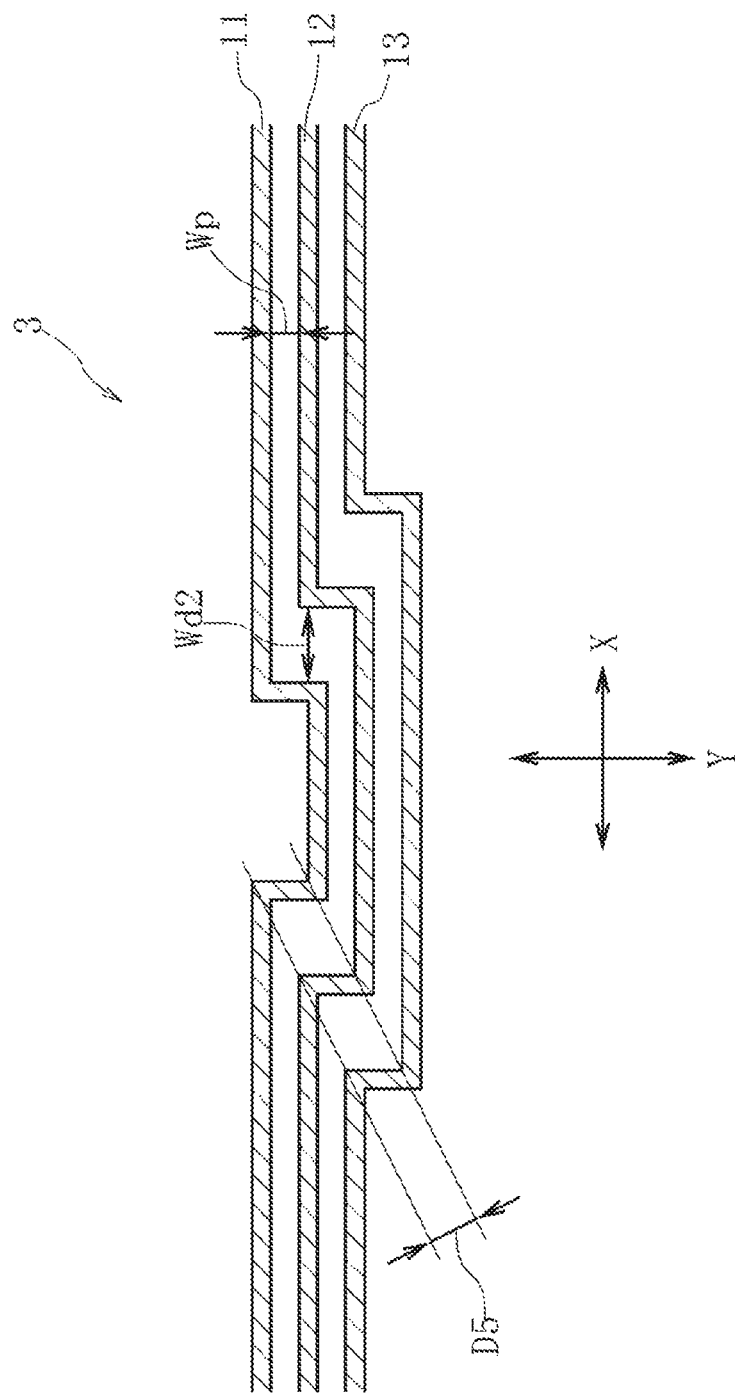
FIG. 4 is a plan view illustrating a wiring structure of a third embodiment of the disclosure.

FIG. 4 illustrates a wiring structure 3 of a third embodiment of the disclosure. In the wiring structure 3, the interval Wp between the wiring patterns 11, 12, and 13 in the parallel wiring portion is the same as those of the above embodiments. In a wiring path change portion D5, the respective wiring patterns 11, 12, and 13 are bent at a right angle.

Even in the wiring structure 3, the crosstalk noise can be reduced without increasing the width dimension in the Y direction.

Figure 5:
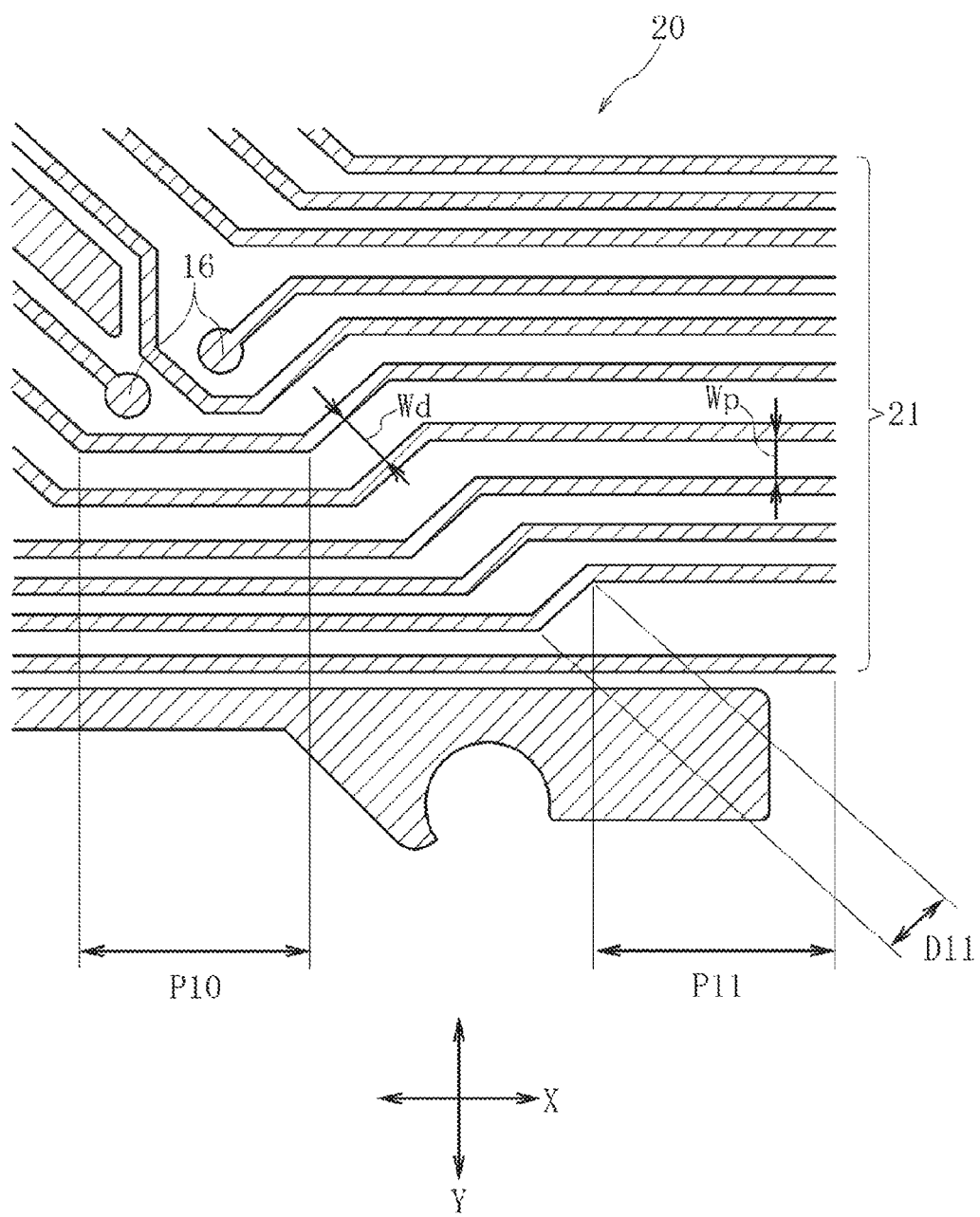
FIG. 5 is a plan view illustrating a part of a printed wiring substrate of the embodiment of the disclosure.

FIG. 5 illustrates a part of a printed wiring substrate 20 on which the wiring structure 1 illustrated in FIG. 1 is applied.

The printed wiring substrate 20 includes a plurality of wiring patterns 21 in the surface of a hard or flexible substrate. In the wiring structure, there are provided the parallel wiring portions P10 and P11 and a wiring path change portion D11. In the wiring path change portion D11, the respective wiring patterns are extended at a slope intersecting with the first direction, and the wiring patterns are formed with an interval therebetween in the first direction (X direction).

The crosstalk noise between the wiring patterns can be reduced by widening the interval Wd between the adjacent wiring patterns in the wiring path change portion D11. In addition, the interval Wp in the Y direction of the wiring patterns 21 can be made narrow in the parallel wiring portions P10 and P11. Therefore, the wiring patterns 21 can be densely disposed in a narrow wiring area.

Figure 6A:
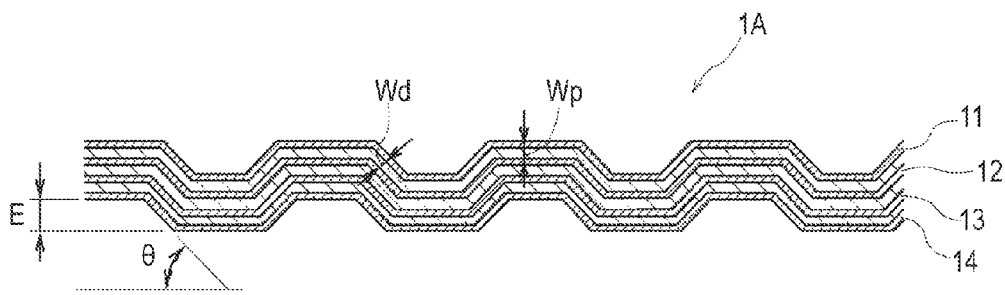
FIGS. 6A, 6B, and 6C are explanatory diagram for comparing the wiring structure of the embodiment of the disclosure with the wiring structure of the comparative example.
Figure 6B:
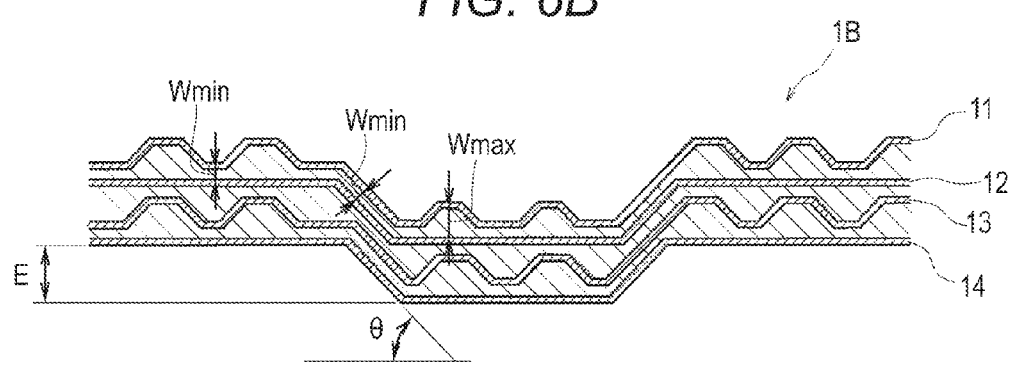
Figure 6C:
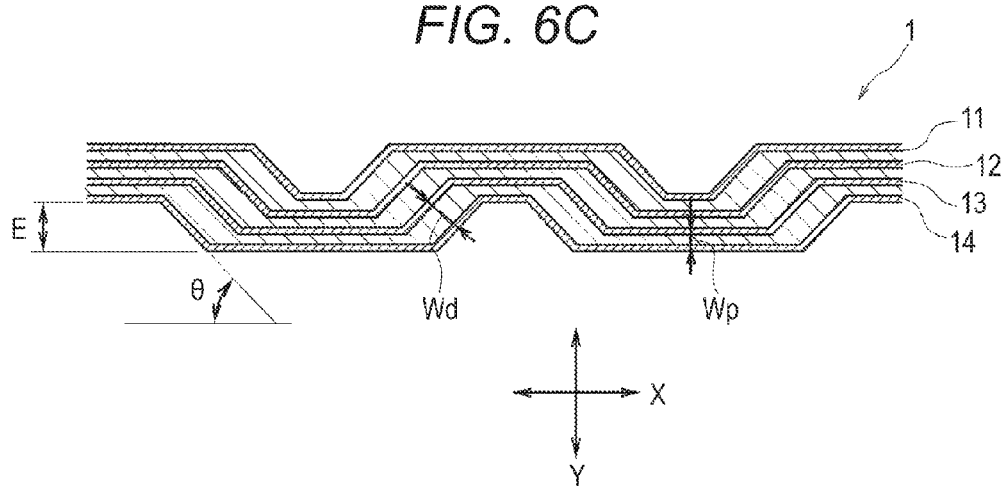

FIG. 6 illustrates the embodiment and the comparative example of the disclosure. FIG. 6C illustrates the wiring structure 1 of the first embodiment of the disclosure as illustrated in FIG. 1. FIG. 6A illustrates the wiring structure 1A of the comparative example as illustrated in FIG. 2. FIG. 6B illustrates a wiring structure 1B of a second comparative example. The wiring structure 1B is substantially matched to the wiring structure disclosed in JP 2003-258394 A.

In the wiring structure 1 illustrated in FIG. 6C, all the width dimensions of the wiring patterns 11, 12, 13, and 14 are 0.1 mm. The interval Wp between the adjacent wiring patterns in the parallel wiring portion is 0.1 mm, and the interval Wd between the adjacent wiring patterns in the wiring path change portion is 0.3 mm. A distance E that the parallel wiring portion is shifted in position in the second direction (Y direction) is 0.4 mm. An angle θ with respect to the X direction of the wiring patterns 11, 12, 13, and 14 in the wiring path change portion is 45 degrees.

In the wiring structure 1A of the comparative example illustrated in FIG. 6A, all the width dimensions of the wiring patterns 11, 12, 13, and 14 are 0.1 mm. The interval Wp between the adjacent wiring patterns in the parallel wiring portion and the interval Wd between the adjacent wiring patterns in the wiring path change portion both are 0.1 mm. The distance E that the parallel wiring portion is shifted in position in the second direction (Y direction) is 0.4 mm. An angle θ with respect to the X direction of the wiring patterns 11, 12, 13, and 14 in the wiring path change portion is 45 degrees.

In the wiring structure 1B of the comparative example illustrated in FIG. 6C, all of the width dimensions of the wiring patterns 11, 12, 13, and 14 are 0.1 mm. A minimum value Wmin of the interval between the adjacent wiring patterns is 0.1 mm, and a maximum value Wmax is 0.4 mm. The distance E that the parallel wiring portion is shifted in position in the second direction (Y direction) is 0.4 mm. An angle θ with respect to the X direction of the wiring patterns 11, 12, 13, and 14 in the wiring path change portion is 45 degrees.

Regions occupied by the respective wiring structures are shown in hatched lines in FIGS. 6A, 6B, and 6C. When the region occupied by the wiring structure 1A of the comparative example illustrated in FIG. 6A (an area of the hatched region) is set to "1", an area occupied by the wiring structure 1B of the second comparative example illustrated in FIG. 6B (an area of the hatched region) is "1.44", and an area occupied by the wiring structure 1 of the first embodiment of the disclosure illustrated in FIG. 6C (an area of the hatched region) is "1.16".

When a wiring distance in the X direction of the wiring pattern illustrated in FIGS. 6A, 6B, and 6C is set to 100 mm, a difference in wiring length of the wiring patterns is 0 mm in the wiring structure 1A of the comparative example illustrated in FIG. 6A and the wiring structure 1 of the embodiment illustrated in FIG. 6C, and a ratio of the difference of the wiring length is 0%. On the other hand, in the wiring structure 1B of the second comparative example illustrated in FIG. 6B, a difference in wiring length of the wiring patterns is 13 mm, and a ratio of the difference in wiring length is 13%.

As described above, the necessary wiring region of the wiring structure 1 of the embodiment of the disclosure can be made narrow. Further, the difference in wiring length of the wiring patterns also is not increased.

Figure 7:
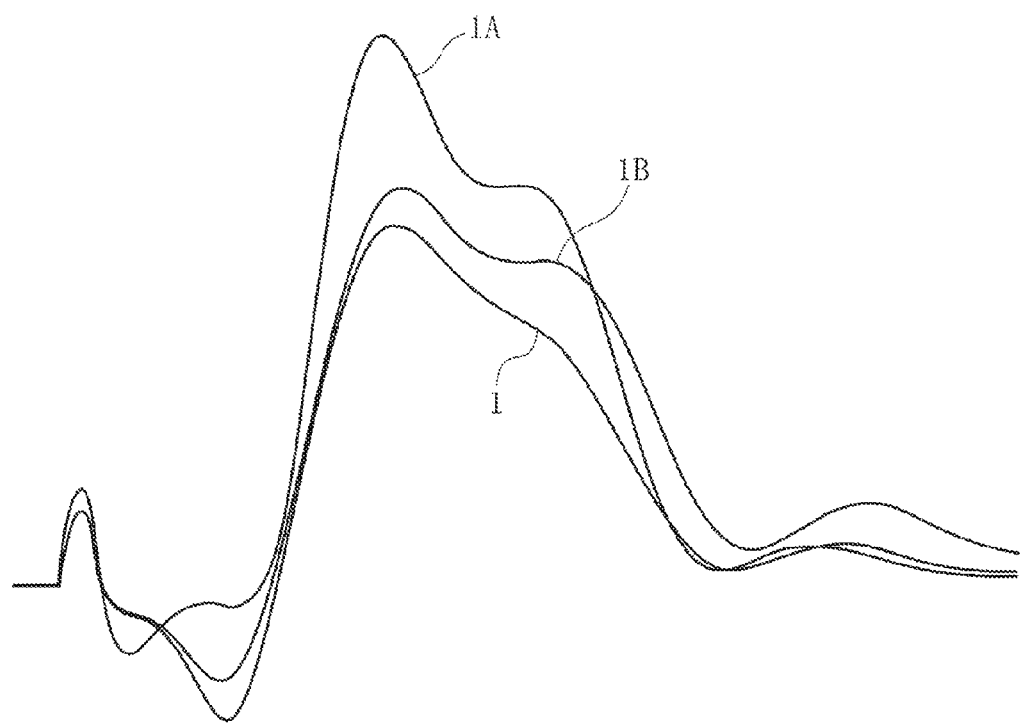
FIG. 7 is an explanatory diagram for comparing a crosstalk noise in the wiring structures of the embodiment and the comparative example illustrated in FIG. 6.

FIG. 7 illustrates the crosstalk noises in the wiring structures 1A, 1B, and 1C illustrated in FIGS. 6A, 6B, and 6C for comparison. A rectangular signal having a maximum voltage of 3.3 V, a rising time of 100 psHz, and a duty ratio of 50% is applied to one of the adjacent wiring patterns, and the crosstalk noise generated at the rising time of the rectangular signal is measured. The crosstalk noises are depicted in FIG. 7 on a magnified scale. It can be seen that the crosstalk noise of the wiring structure 1 of the embodiment of the disclosure is improved compared to those of the wiring structures 1A and 1B of the comparative examples.

What is claimed is:

1. A wiring structure comprising:
 a plurality of wiring patterns,
 wherein the plurality of wiring patterns include a parallel wiring portion that is extended in parallel in a first direction, and a wiring path change portion that is extended in the middle of the parallel wiring portion and in a direction where the wiring patterns are intersected with the first direction, and
 wherein an interval between the wiring patterns in the wiring path change portion is wider than an interval of the wiring patterns in the parallel wiring portion;
 wherein a width of the wiring in the parallel wiring portion is equal to a width of the wiring in the wiring path change portion.

2. The wiring structure according to claim 1,
 wherein the wiring path change portion is positioned between two parallel wiring portions which are shifted in a second direction perpendicular to the first direction.

3. The wiring structure according to claim 2, further comprising:
 a first parallel wiring portion;
 a second parallel wiring portion that is shifted from the first parallel wiring portion in the second direction; and
 a third parallel wiring portion that is shifted from the second parallel wiring portion in the second direction,
 wherein the wiring path change portion is provided between the first parallel wiring portion and the second parallel wiring portion and between the second parallel wiring portion and the third parallel wiring portion.

4. The wiring structure according to claim 3,
 wherein the wiring patterns forming the first parallel wiring portion and the wiring patterns forming the third parallel wiring portion are positioned on the same line in the first direction.

5. The wiring structure according to claim 1,
 wherein the wiring patterns are parallel to each other in the wiring path change portion.

6. A printed wiring substrate comprising:
the wiring structure according to claim 1 printed on a surface of a substrate.
7. The printed wiring substrate according to claim 6, wherein a through hole is formed at a place facing the wiring path change portion.
8. The printed wiring substrate according to claim 6, wherein an electronic component is disposed at a place facing the wiring path change portion.

* * * * *